United States Patent
Lehman, Jr.

(10) Patent No.: US 7,351,784 B2
(45) Date of Patent: *Apr. 1, 2008

(54) CHIP-PACKAGING COMPOSITION OF RESIN AND CYCLOALIPHATIC AMINE HARDENER

(75) Inventor: Stephen E. Lehman, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/241,258

(22) Filed: Sep. 30, 2005

(65) Prior Publication Data

US 2007/0090532 A1   Apr. 26, 2007

(51) Int. Cl.
*C08G 59/50* (2006.01)

(52) U.S. Cl. .................. 528/122; 525/523; 528/94; 528/120

(58) Field of Classification Search .................. None
See application file for complete search history.

(56) References Cited

U.S. PATENT DOCUMENTS

| | | | | |
|---|---|---|---|---|
| 4,013,747 A | * | 3/1977 | Hampel | 264/73 |
| 4,321,354 A | * | 3/1982 | Kluger et al. | 528/122 |
| 4,874,548 A | * | 10/1989 | Hajovsky | 252/511 |
| 5,025,078 A | * | 6/1991 | Lucas et al. | 528/120 |
| 5,252,631 A | * | 10/1993 | Owens | 523/137 |
| 5,258,426 A | * | 11/1993 | Uchida et al. | 523/435 |
| 5,508,373 A | * | 4/1996 | Shah et al. | 528/120 |
| 6,642,344 B1 | * | 11/2003 | House et al. | 528/91 |
| 7,141,629 B2 | * | 11/2006 | Chow et al. | 525/523 |
| 2007/0152311 A1 | * | 7/2007 | Jayaraman et al. | 257/678 |

FOREIGN PATENT DOCUMENTS

EP           860486 A1 *  8/1998
WO      WO 98/28379 A1 *  7/1998

OTHER PUBLICATIONS

Chemical abstracts registry No. 6864-37-5 for 3,3'-dimethyl-4,4'-dimainocyclohexylamine, or Ancamine 2049, 1967, one page.*
Arduengo, III, A. J., et al., "An Air Stable Carbene and Mixed Carbene "Dimers"", *J. Am. Chem. Soc.*, vol. 119(52), (1997), 12742-12749.
Arduengo, III, A. J., "Looking for Stable Carbenes: The Difficulty in Starting Anew", *Accounts of Chemical Research*, 32(11), (Nov. 1999), 913-921.
Trnka, T. M., et al., "Synthesis and Activity of Ruthenium Alkylidene Complexes Coordinated with Phosphine and N-Heterocyclic Carbene Ligands", *J. Am. Chem. Soc.*, 125(9), (2003), 2546-2554.

* cited by examiner

*Primary Examiner*—Robert Sellers
(74) *Attorney, Agent, or Firm*—Schwegman, Lundberg & Woessner, P.A.

(57) ABSTRACT

A chip-packaging composition includes a thermosetting resin and at least one of an N-heterocyclic carbene adduct, an imidazole, and a cycloaliphatic amine hardener. The chip-packaging composition is applied to flip-chip technology during no-flow underfill mounting of the flip-chip to a mounting substrate. The mounting substrate can be further mounted on a board. A process includes formation of the chip-packaging composition. A method includes assembly of the chip-packaging composition with the flip-chip, and further can include assembly of the mounting substrate to a board. A computing system is also included that uses the chip-packaging composition.

4 Claims, 5 Drawing Sheets

CHIP-PACKAGING COMPOSITION OF RESIN AND CYCLOALIPHATIC AMINE HARDENER

TECHNICAL FIELD

Disclosed embodiments relate to resin encapsulant and underfill compositions and microelectronic packages assembled therewith.

BACKGROUND INFORMATION

Epoxy-based compositions are used frequently for encapsulation of microelectronic devices as well as for capillary and no-flow underfill processes. Encapsulation is employed to protect components of electronic devices from environmental and thermomechanical stresses. Flip-chip technology employs underfill to reinforce solder joints by filling the space between the flip-chip die and the mounting substrate.

An encapsulant composition is applied to an electronic part to completely cover and protect the sensitive components such as the die, wire bonds, solder joints, and capacitors. Encapsulants can be applied to the electronic devices by one of several methods including resin transfer molding, cavity filling dispense, dam and fill dispense, and stencil printing, resin film infusion, and liquid molding A "capillary underfill" process typically proceeds by first aligning the solder bumps on a flip-chip with the pads on a substrate, and the solder is reflowed to form the solder joints. After forming the solder joints, the underfill composition is flowed between the flip-chip and the mounting substrate. Thereafter, the underfill composition is cured. Capillary underfilling can be assisted by pumping the underfill composition between the flip-chip and the mounting substrate, or by vacuum-assisted drawing the underfill composition between the flip-chip and the mounting substrate. Capillary underfill can also be used to protect the solder joints used to make the electrical connections from the electronic package to a system level board or motherboard.

The "no-flow" underfill process is another method of underfilling a flip-chip device. In a no-flow underfill process, the underfill composition is dispensed on the mounting substrate or the flip-chip, and the flip-chip and the mounting substrate are brought into contact. The solder bumps that are on the chip are aligned with the pads on the substrate. Next, the underfill composition is cured prior to or substantially simultaneously with reflowing the solder bumps to create the solder joints.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Embodiments relate to encapsulants or underfill compositions that can be activated and cured at low temperatures such as but not limited to between about 50° C. to about 140° C. The low curing temperature ranges facilitate a smaller thermal budget during chip packaging. Hereinafter, the encapsulants or underfill compositions will be referred to as chip-packaging compositions unless explicitly referred to otherwise. In any event, the chip-packaging composition include application as either an encapsulant or an underfill.

The following description includes terms, such as upper, lower, first, second, etc., that are used for descriptive purposes only and are not to be construed as limiting. The embodiments of a device or article described herein can be manufactured, used, or shipped in a number of positions and orientations.

The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials.

A board is typically a resin-impregnated fiberglass structure that acts as a mounting substrate for the die. A board can be prepared with a bond pad, also referred to as a bond finger, that is flush with the board, or the bond pad can be upon the board surface. As depicted in this disclosure, a bond pad is not limited to being flush or being upon the surface only because it is illustrated as such, unless it is explicitly stated in the text.

A "solder bump" or "electrical bump" is understood to be a unit of electrically conductive material such as a tin-lead solder, a tin-indium solder, a tin-bismuth solder, a tin-silver solder, or other solders that are used in the microelectronic arts. The terms "solder bump" and "electrical bump" can be used interchangeably. Additionally, other electrical communication structures can be used, such as a pin in a pin-grid array.

The effectiveness of an encapsulant or underfill composition depends on its chemical, physical, and mechanical properties. Properties that make an encapsulant or underfill composition desirable include low coefficient of thermal expansion (CTE), low moisture uptake, high adhesion, high toughness, high glass transition (Tg) temperature, high heat distortion temperature, and others. The encapsulant or underfill composition includes particulate filler inorganics such as silica or the like, and metal flakes or the like. The particulate filler increases the modulus and reduces the CTE of the composite adhesive, in order to better match the CTE of silicon and the glass fiber composite substrate material. An example of a silica-filled encapsulant or underfill composition is silica-filled epoxy-based liquid formulation.

Figure 1A:
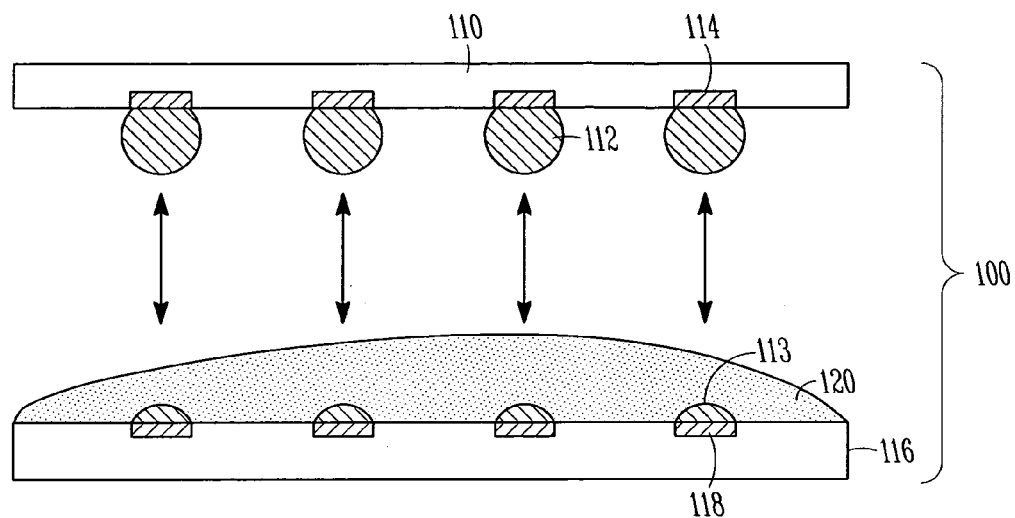
FIG. 1A is a cross-section of a package during a no-flow encapsulant or underfill process according to an embodiment.

FIG. 1A is a cross-section of a package 100 during a no-flow chip-packaging process according to an embodiment. The package 100 includes a flip-chip 110 and a solder bump 112 that is attached to the flip-chip 110. Electrical coupling for the flip-chip 110 is accomplished through a die bond pad 114 that is disposed on the flip-chip 110.

In an embodiment, a mounting substrate 116 is included. The mounting substrate 116 is part of a printed wiring board (PWB) such as a main board. In an embodiment, the mounting substrate 116 is part of an interposer. In an embodiment, the mounting substrate 116 is part of a mezzanine PWB. In an embodiment, the mounting substrate 116 is part of an expansion card PWB. In an embodiment, the mounting substrate 116 is part of a small PWB such as a board for a handheld device such as a cell phone or a personal digital assistant (PDA).

The mounting substrate 116 is also brought near the flip-chip 110 as indicated by the directional arrows therebetween. The mounting substrate 116 includes a substrate bond pad 118 for electrical communication with the flip-chip 110. The mounting substrate 116 is covered with a no-flow underfill composition 120. In an embodiment, the mounting substrate 116 is prepared with a mounting substrate solder bump 113, which is disposed upon the mounting substrate 116 before the deposition of the underfill composition 120. In an embodiment, the underfill composition 120 is alternatively deposited upon the flip-chip 110 instead of on the mounting substrate 116. The chip-packaging composition 120 has unique formulations, according to various embodiments, and will be described below in greater detail.

A method of assembling the package 100 includes bringing the flip-chip 110 and the mounting substrate 116 together after depositing the underfill composition 120 on either or both of the flip-chip 110 or the mounting substrate 116.

Figure 1B:
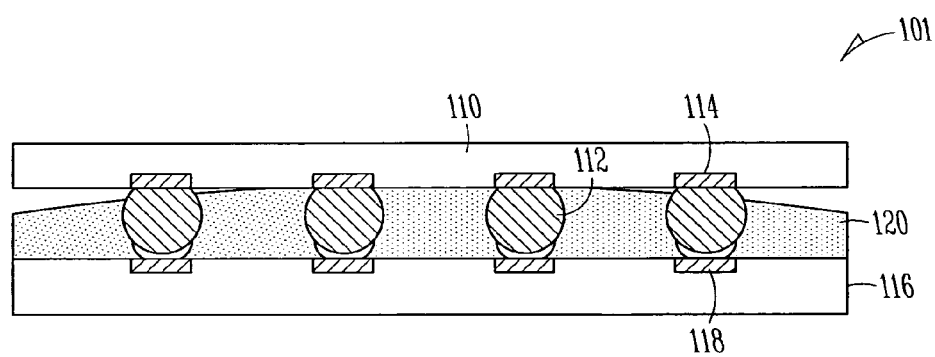
FIG. 1B is a cross-section of the package depicted in FIG. 1A after further processing.

FIG. 1B is a cross-section of the package depicted in FIG. 1A after further processing. The package 101 is depicted during assembly. The solder bump 112 is depicted as being forced through the underfill composition 120 in anticipation of making electrical contact with the substrate bond pad 118. The solder bump 12 penetrates the underfill composition 120. The underfill composition 120 is not pre-gelled. This allows particulate fillers to flow laterally away from the substrate bond pad 118. This also allows the underfill composition 120 to be completely penetrated by the solder bump 112. In the first instance, the particulate fillers would prevent a useful contact between the solder bump 112 and the substrate bond pad 118. In the second instance, the pre-gelled underfill composition 120 would also prevent a useful contact between the solder bump 112 and the substrate bond pad 118.

In an embodiment, the particulate filler is present from a trace amount, up to about 75% of the total weight of the composite that includes the chip-packaging composition. In an embodiment, the particulate filler is present in a range from about 30% to about 70% of the total weight of the composite that includes the chip-packaging composition. In an embodiment, the particulate filler is present in a range from about 45% to about 55% of the total weight of the chip-packaging composite.

Figure 1C:
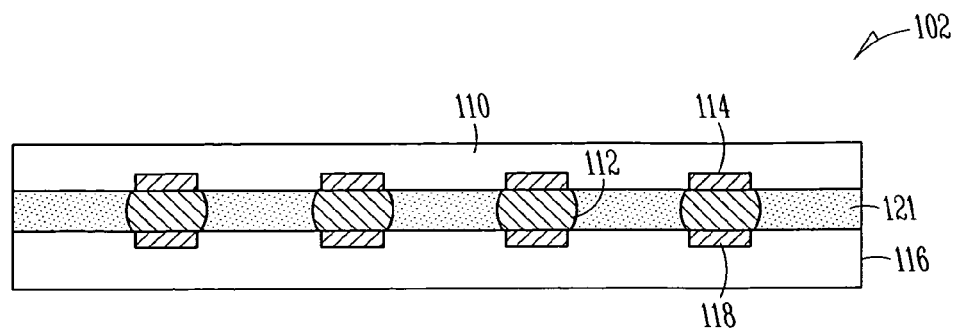
FIG. 1C is a cross-section of the package depicted in FIG. 1B after further processing.

FIG. 1C is a cross-section of the package depicted in FIG. 1B after further processing. The package 102 is depicted after full contact between the solder bump 112 and the substrate bond pad 118. In an embodiment, the solder bump 112 is reflowed by heating the package 102. During curing, the underfill composition 120 cleaves heterocyclic carbene adducts, which begins to cure the underfill composition 120 within a low temperature range.

In an embodiment, the underfill composition 120 is B-staged as is known in the art, and complete curing is delayed in accordance with more effective use of the thermal budget of the package 102 with further back-end-of-line (BEOL) packaging processing. Accordingly, the underfill composition 120 (FIG. 1B) is depicted as item 121 (FIG. 1C) to distinguish it as a completely cured underfill composition with residues according to an embodiment as set forth herein.

The package 102 is depicted after a curing process has been carried out. In an embodiment, the curing process is carried out according to specific methods. In an embodiment, curing is followed by reflowing of the solder bump 112 onto the substrate bond pad 118. In an embodiment, curing and reflowing are carried out substantially simultaneously. In an embodiment, curing is carried out by various processing paths including autocatalytic, additive catalytic, diluent cross-linking/hardening, thermoset, and combinations thereof.

In an embodiment, curing the underfill composition 121 is cured by an autocatalytic process. The autocatalytic process is carried out in an embodiment by providing a reactive diluent in the underfill composition 121. In an embodiment, the curing process is carried out by an additive catalytic curing process. The additive catalytic curing process includes an additive such as a metal catalyst powder that causes the underfill composition 121 to cure. In an embodiment, a cross-linking/hardening process is carried out to cure the underfill composition 121. Examples of specific cross-linker/hardener composition are set forth herein. In an embodiment, a thermoset curing process is carried out. Typically, several curing process embodiments are assisted by thermal treatment. However, in some embodiments, such as the use of an epoxy alone, thermoset processing may be done without other curing agent processes.

Figure 1D:
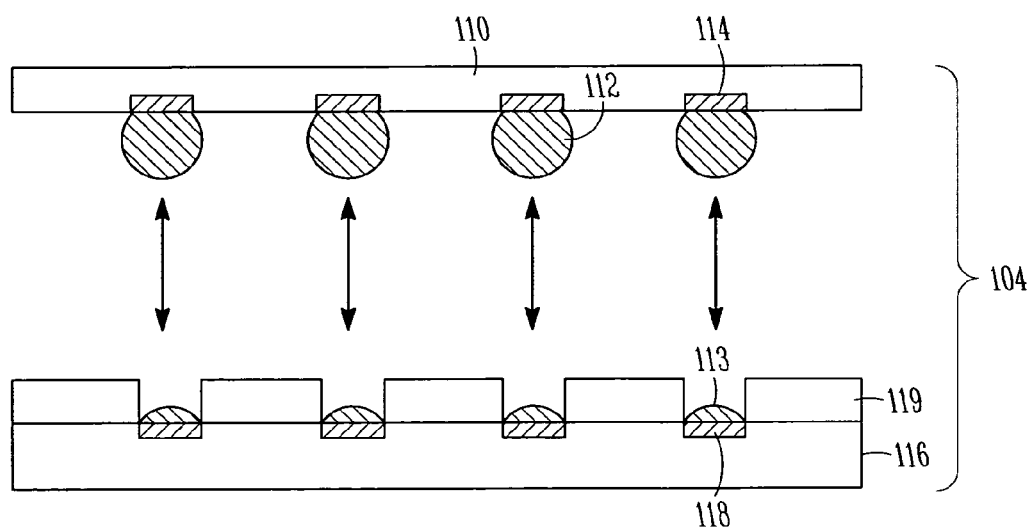
FIG. 1D is a cross-section of a package during a no-flow underfill process according to an embodiment.

FIG. 1D is a cross-section of a package 104 during a no-flow underfill process according to an embodiment. The package 104 includes the flip-chip 110 and the solder bump 112 that is attached to the flip-chip 110. Electrical coupling for the flip-chip 110 is accomplished through a die bond pad 114 that is disposed on the flip-chip 110.

A mounting substrate 116 is included. The mounting substrate 116 is prepared by forming a mounting substrate solder bump 113. In an embodiment, the mounting substrate solder bump 113 is first formed on the mounting substrate 116 by a process such as screen printing. Thereafter, the mounting substrate 116 is further prepared with a no-flow underfill composition 119, which is patterned such as by screen printing. In an embodiment, the no-flow underfill composition 119 is patterned by virtue of non-wetting qualities with respect to the mounting substrate solder bump 113, but with wetting qualities with respect to the mounting substrate 116.

The mounting substrate 116 is also brought near the flip-chip 110 as indicated by the directional arrows therebetween. The mounting substrate 116 includes a substrate bond pad 118 for electrical communication with the flip-chip 110. In an embodiment, the no-flow underfill composition 119 is alternatively deposited upon the flip-chip 110 instead of on the mounting substrate 116. The underfill composition 119 has unique formulations, according to various embodiments, and will be described below in greater detail.

A method of assembling the package 100 includes bringing the flip-chip 110 and the mounting substrate 116 together after depositing the no-flow underfill composition 119 on either or both of the flip-chip 110 or the mounting substrate 116.

Chip-packaging Compositions

In an embodiment, the chip-packaging composition, whether it is an underfill composition or an encapsulation composition, includes an N-heterocyclic carbene catalyst, an epoxy resin, and the solution, reaction, and mixture products thereof including residue. In an embodiment, the chip-packaging composition includes a cycloaliphatic amine hardener, an epoxy resin, and the solution, reaction, and mixture products thereof including residue. In an embodiment, the chip-packaging composition includes an imidazole catalyst, an epoxy resin, and the solution, reaction, and mixture products thereof including residue.

Resins

Several resin types can be used in the chip-packaging composition and in connection with at least one of the N-heterocyclic carbene catalysts, the imidazole, and the cycloaliphatic amine hardener. In an embodiment, an epoxy resin is used as the principal component in the chip-packaging composition. In an embodiment, a diglycidyl ether of bisphenol-F is used. In an embodiment, a reaction product of bisphenol-F and epichlorohydrin is used. In an embodiment, a diglycidyl ether of bisphenol-A is used. In an embodiment, a reaction product of bisphenol-A and epichlorohydrin is used. In an embodiment, a multifunctional resin is used. In an embodiment, the multifunctional resin is an epoxylated novolac. In an embodiment, the multifunctional resin is an epoxylated cresol-formaldehyde resin. In an embodiment, the "resin" is a latex-based composition.

In an embodiment, the thermosetting resin includes an epoxy and at least one of a co-curing compound selected from a maleimide, a cyanate ester, and a vinyl ether, and the solution, reaction, and mixture products thereof.

In an embodiment, the thermosetting resin includes a maleimide. In an embodiment, the thermosetting resin includes a cyanate ester. In an embodiment, the thermosetting resin includes an ethynyl. In an embodiment, the thermosetting resin includes a vinyl.

N-Heterocyclic Carbene Catalysts

In an embodiment, the N-heterocyclic carbene catalyst includes the adduct of an N-heterocyclic carbene and an HY compound:

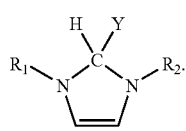

(1)

During processing, the adduct is activated in a temperature range from about 50° C. to about 150° C., in connection with the resin. Accordingly, the adduct dissociates to liberate the HY compound and, e.g., the carbene

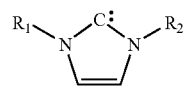

(2)

begins to achieve polymerization of the resin in the chip-packaging composition.

In an embodiment, the HY compound, includes an electrophillic CH second compound in connection with the carbene first compound. In an embodiment, the HY compound includes a fluorobenzene. In an embodiment, the HY compound includes pentaflourobenzene. In an embodiment, the HY compound includes an aldehyde. In an embodiment, the HY compound includes an aromatic aldehyde. In an embodiment, the HY compound includes an unsubstituted aromatic aldehyde. In an embodiment, the HY compound includes a substituted aromatic aldehyde. In an embodiment, HY compound includes a C 1-20 aliphatic. In an embodiment, HY compound includes a C 1-20 cycloaliphatic. In an embodiment, HY compound includes a C 1-20 branched aliphatic. In an embodiment, HY compound includes a C 1-22 aromatic. In an embodiment, HY compound includes a C 1-22 fluoroaromatic. In an embodiment, HY compound includes a C 1-20 aldehyde. In an embodiment, HY compound includes a C 1-20 ketone. In an embodiment, HY compound includes a C 1-20 ether. In an embodiment, HY compound includes a C 1-20 amine. In an embodiment, HY compound includes a C 1-20 amide.

In an embodiment, at least one of the R1 and R2 functional groups include H as the entire functional group. In an embodiment, at least one of the R1 and R2 functional groups includes an aromatic. In an embodiment, at least one of the R1 and R2 functional groups includes a substituted aromatic. In an embodiment, at least one of the R1 and R2 functional groups includes an aliphatic. In an embodiment, at least one of the R1 and R2 functional groups includes a substituted aliphatic. In an embodiment, at least one of the R1 and R2 functional groups includes a cycloaliphatic. In an embodiment, at least one of the R1 and R2 functional groups includes a substituted cycloaliphatic. In an embodiment, at least one of the R1 and R2 functional groups includes a fluoroalkyl. In an embodiment, at least one of the R1 and R2 functional groups includes a fluoroaromatic. In an embodiment, the R1 and R2 functional groups are any combination of two of the above. In an embodiment, the R1 and R2 functional groups are substantially identical compounds.

In an embodiment, the N-heterocyclic carbene catalyst includes the adduct composition

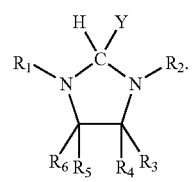

(3)

The functional groups R1, R2, R3, R4, R5, and R6, can be any combination of the R1 and R2 functional group examples set forth above and can be independently selected from hydrogen, aliphatics, substituted aliphatics, aromatics, substituted aromatics, cycloaliphatics, and substituted cycloaliphatics.

During processing, the adduct is activated in a temperature range from about 50° C. to about 150° C., in connection with the resin. Accordingly, the adduct dissociates and, e.g., the carbene radical

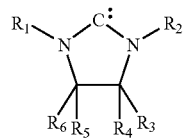

(4)

begins to achieve polymerization of the resin in the chip-packaging composition. The functional groups R1, R2, R3, R4, R5, and R6, can be any combination of the R1 and R2 functional group examples set forth above and can be independently selected from hydrogen, aliphatics, substituted aliphatics, aromatics, substituted aromatics, cycloaliphatics, and substituted cycloaliphatics.

In an embodiment, the HY functional group depicted in Equation (1), includes an electrophillic CH second compound in connection with the carbene first compound. In an embodiment, the Y group is any of the HY compounds set forth above with respect to the functional group depicted in equation (1).

Resin Carbene-Adduct Combinations

A number of resin carbene-adduct examples follow. These include resin and N-heterocyclic carbene catalyst chip-packaging compositions. In these examples, epoxy resins are used along with N-heterocyclic carbene adducts. In the following examples, inorganic fillers are also used.

Table 1 illustrates the various samples. In the several examples, samples are prepared by blending the composition components together in a planetary mixer and/or a 3-roll mill. The samples are prepared at room temperature while applying vacuum over the composition. After the mixing processes set forth above, the chip-packaging compositions are transferred to a pan and cured in a convection oven at 125° C. for about 2 hours.

TABLE 1

Carbene-Adduct Catalyst Chip-packaging Compositions

| Sample No. | N-hetero Cyclic Carbene | Carbene mass, g | Epoxy resin | Epoxy resin mass, g |
|---|---|---|---|---|
| 1 | Pentafluoro Benzene | 5 | DER 332 | 75 |
| 2 | Benzaldehyde | 5 | DER 332 | 75 |

Imidazole Catalysts

In an embodiment, the catalyst includes an imidazole composition. In an embodiment, the imidazole includes

(5)

and the substituted version thereof as known in the art, for example the Curezole® series produced by Air Products.

The cure temperature is in a range from about 50° C. to about 150° C., in connection with the resin. Accordingly, the unsubstituted imidazole begins to catalyze the resin to achieve homopolymerization of the resin in the chip-packaging composition.

Particularly useful imidazol compounds for these embodiments are Curezol® 1B2MZ, Curezol® 2E4MZ, and Curezol® AMI-2.

Resin-Imidazole Combinations

A number of resin-imidazole examples follow. These include cured resin and imidazole catalyst chip-packaging compositions. In these examples, epoxy resins are used along with imidazoles. In the following examples, inorganic fillers are also used.

Table 2 illustrates the various samples. In the several examples, samples are prepared by stirring the composition components together in a planetary mixer and a 3-roll mill. The samples are prepared at room temperature while reducing ambient pressure over the composition. After the mixing processes set forth above, the chip-packaging compositions are transferred to a pan and cured in a convection oven at about 70° C. for about 6 hours.

TABLE 2

Imidazole Catalyst Chip-packaging Compositions

| Sample No. | Imidazole | Imidazole mass, g | Epoxy resin | Epoxy resin Mass, g | Silica Particulate Filler, g |
|---|---|---|---|---|---|
| 3 | Curezol® 1B2MZ | 4 | DER 354 | 100 | 193 |
| 4 | Curezol® 2E4MZ | 4 | DER 354 | 100 | 193 |
| 5 | Curezol® AMI-2 | 4 | DER 354 | 100 | 193 |

Cycloaliphatic Amine Hardeners

Several cycloaliphatic diamine hardeners can be used according to an embodiment. In an embodiment, the cycloaliphatic diamine hardener includes primary or secondary amine groups. In an embodiment, the cycloaliphatic diamine hardener includes carbon skeletons of five and six-member rings. In an embodiment, the cycloaliphatic diamine hardener features steric congestion near the amine groups.

In an embodiment, the cycloaliphatic diamine hardener is monocyclic or multicyclic in another embodiment. One cycloaliphatic diamine hardener embodiment includes menthane diamine and the like. One cycloaliphatic diamine hardener embodiment includes isophorone diamine and the like. One cycloaliphatic diamine hardener embodiment includes various members of the Ancamine® series, which is manufactured by Air Products Incorporated, of Allentown, Pa. Other commercial hardeners are examples of cycloaliphatic hardener embodiments. In an embodiment, the cycloaliphatic diamine hardener is the structure

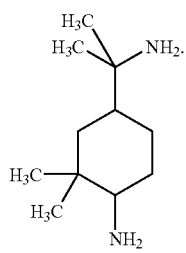

(5)

In an embodiment, the cycloaliphatic diamine hardener is the structure

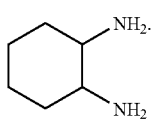

(6)

Cycloaliphatic amine hardeners are used according to an embodiment, which allow for hardening at an economized thermal budget during processing. In an embodiment, the hardener is used in connection an epoxy resin for an chip-packaging composition. Curing with a cycloaliphatic amine hardener can be carried out in a temperature range from about 50° C. to about 125° C. and above. The rate of curing for the hardener can be affected by the temperature, with a direct proportionality therebetween.

In a process embodiment, a cycloaliphatic amine hardener is added to an epoxy resin mass in a ratio of about 1:3 hardener-to-resin, and the composition is cured at about 125° C. for about 2 hours. The resulting chip-packaging composition achieves a Tg in a range from about 123° C. to about 160° C.

A number of cycloaliphatic amine hardener examples follow. In these examples, epoxy resins were obtained from Dow Chemical Co. Such epoxy resins were of the DER™ type. In the following examples, Ancamine® brand cycloaliphatic amine hardeners were obtained from Air Products, Inc. In the following examples, inorganic fillers were obtained from Denka Corporation of New York, N.Y., and included several examples from the FB® brand fillers.

Table 3 illustrates the various samples and selected resultant properties. In the several examples, samples were prepared by stirring the components together at room temperature using a 1-Liter glass reaction kettle fitted with an overhead mechanical stirrer, stoppers, and a vacuum valve. The components were stirred for 10 minutes while a vacuum was applied to degas the sample. After stirring, the samples were allowed to sit in the vacuum for about 1 minute to further degas. Thereafter, stirring was resumed for about 10 minutes, followed by further degassing without stir for about 1 minute.

After the mixing processes set forth above, the chip-packaging compositions were transferred to a 10 cm diameter, 1 cm depth aluminum pan and cured in a convection oven at 125° C. for about 2 hours.

TABLE 2

Cycloaliphatic Amine Hardened Chip-packaging Compositions

| Sample No. | Diamine | Diamine mass, g | Epoxy resin | Epoxy resin mass, g | Denka Filler | Filler mass, g | Tg, ° C. |
|---|---|---|---|---|---|---|---|
| 8 | Ancamine 2267 | 15 | DER 332 | 48.96 | FB-74X FB-35X | each 31.92 | 154.6 |
| 9 | Ancamine 2264 | 15 | DER 332 | 48.06 | FB-74X FB-35X | Each 31.92 | 144.6 |
| 10 | Ancamine 2049 | 23 | DER 332 | 66.32 | FB-74X FB-35X | Each 31.92 | 149.2 |
| 11 | Ancamine 2049 | 23 | DER 332 | 69.19 | FB-74X FB-35X | Each 31.92 | 149.2 |
| 12 | Ancamine 2264 | 20 | DER 332 | 66.85 | FB-74X FB-35X | Each 31.92 | 141.7 |
| 13 | Ancamine 2049 | 20 | DER 332 | 62.33 | FB-74X FB-35X | Each 31.92 | 147.5 |
| 14 | Ancamine 2264 | 20 | DER 332 | 69.26 | FB-74X FB-35X | Each 31.92 | 137.8 |
| 15 | Ancamine 2267 | 20 | DER 332 | 70.57 | FB-74X FB-35X | Each 31.92 | 146.5 |

In an embodiment, the hardener and resin are present in formulations in equivalent epoxy ratios (ratio of amine hydrogen to epoxy groups) of 0.5:1, of 1:1, and of 4:1, and of ratios therebetween. In a process embodiment, an epoxy resin mass is added to a hardener in a ratio of about 1:3 hardener-to-resin, and the composition is cured at about 125° C. for about 2 hours. The resulting chip-packaging packaging composition achieves a Tg in a range from about 123° C. to about 160° C.

Resin-Catalyst-Hardener Chip-packaging Compositions

A number of resin-catalyst-hardener chip-packaging composition examples follow. In these examples, epoxy resins are used along with imidazolium adduct catalysts and cycloaliphatic amine hardeners.

Table 4 illustrates the various samples. In the several examples, samples are prepared similar to the samples set forth in Table 3. After the mixing processes set forth above, the resin-carbene-hardener chip-packaging compositions are transferred to a pan and cured in a convection oven at 125° C. for about 2 hours. The resin-imidazole-hardener chip-packaging compositions are transferred to a pan and cured in a convection oven at 70° C. for about 6 hours

TABLE 4

Catalyst-Hardener-Resin Chip-packaging Compositions

| Sample No. | Epoxy resin, g | Hardener mass, g | Catalyst | Filler mass, g |
|---|---|---|---|---|
| 16 | 47 | 24 | Pentafluoro benzene, 10 g | 19 |
| 17 | 39 | 20 | Pentafluoro benzene, 11 g | 30 |
| 18 | 30 | 30 | Pentafluoro benzene, 10 g | 30 |
| 19 | 35 | 34 | Phenol aldehyde, 9 g | 26 |
| 20 | 50 | 20 | Phenol Aldehyde, 10 g | 20 |
| 21 | 40 | 20 | Phenol Aldehyde, 8 g | 32 |
| 22 | 65 | 10 | Phenol Aldehyde, 15 g | 10 |
| 23 | 100 | 10 | Imidazole, 4 g | 190 |
| 24 | 100 | 10 | 2-phenylimidazole, 4 g | 190 |
| 25 | 100 | 10 | 2-ethyl 3-ethylcyanoimidazole, 4 g | 190 |
| 26 | 100 | 10 | N-methylimidazole, 4 g | 190 |
| 27 | 100 | 20 | N-methylimidazole, 4 g | 190 |
| 28 | 100 | 10 | 2-ethylimidazole, 4 g | 190 |
| 29 | 100 | 10 | 2-ethylimidazole, 4 g | 190 |

The resin is used in separate embodiments of Sample numbers 18-22 include first a diglycidyl ether of bisphenol-A. Then, in a repeat of Sample numbers 18-22, an oligomer diglycidyl ether of bisphenol-A is used. The filler includes Denka® brand fillers including equal proportions of Denka FB-74X and Denka FB-35X.

Additive Materials

In an embodiment, additive materials are included with the chip-packaging compositions. The additive materials and the chip-packaging compositions constitute "chip-packaging mixtures" according to embodiments set forth herein. But unless expressly defined as such, "chip-packaging mixtures" and "chip-packaging compositions" can be used interchangeably.

Fluxing agents are added to assist in assuring quality electrical connections between the bumps and the bond pads during reflow. In an embodiment, a sulfonic acid-releasing fluxing agent is used. One fluxing agent type includes organic carboxylic acids and the like. Another fluxing agent type includes polymeric fluxing agents and the like. The examples of fluxing agents are any chemicals containing hydroxyl (—OH) group or carboxylic (—COOH) group or both, such as glycerin, ethylene glycol, tartaric acid, adipic acid, citric acid, malic acid, meilic acid, and glutaric acid. The fluxing agent is usable during processing at the temperature ranges set forth in this disclosure for the catalyst and/or hardener embodiments, as well as temperatures ranging between about 100° C. to about 300° C. In an embodiment the fluxing agent is provided in a range from about 1% to about 20% by weight of the total chip-packaging composition when it is prepared.

In an embodiment, one additive material is an elastomer for imparting flexibility to the principal chip-packaging composition. In an embodiment the elastomer is provided in a range from about 0.5o about 5 by weight of the total chip-packaging composition when it is prepared.

Another additive material according to an embodiment is a reactive diluent. The specific reactive diluent that is employed will depend upon compatibility with the chip-packaging composition. Because of the bonding and sealing nature of the process embodiments, the reactive diluent can react or dissolve into the final chip-packaging mixture instead of being volatilized, or it can both react and dissolve. Reactive diluents for the above chip-packaging compositions according to embodiments include other low viscosity epoxy monomers such as phenyl glycidyl ethers, nonyl phenyl glycidyl ethers, p-butylphenyl glycidyl ethers, alkyl $C_8$-$C_{14}$ glycidyl ethers, cyclo aliphatic epoxies and the like. In an embodiment the reactive diluent is provided in a range from about 1% to about 10% by weight of the total chip-packaging composition when it is prepared.

Another additive material according to an embodiment is an adhesion promoter. The specific adhesion promoter that is employed depends upon compatibility with the given chip-packaging composition. Adhesion promoters that can be added to the above chip-packaging compositions include organic and inorganic combinations. In an embodiment, a silane coupling agent or the like is used as an adhesion promoter. In an embodiment, an organo-ziconate composition or the like is used as an adhesion promoter. In an embodiment, an organo-titanate composition or the like is used as an adhesion promoter. In an embodiment the adhesion promoter is provided in a range from about 0.01% to about 5% by weight of the total chip-packaging composition when it is prepared.

Another additive material according to an embodiment is a flow modifier such as a surfactant. The specific flow modifier that is employed depends upon compatibility with the chip-packaging composition. The surfactant requires properties such as compatibility with the chip-packaging composition. In an embodiment, the surfactant is anionic such as long chain alkyl carboxylic acids, such as lauric acids, steric acids, and the like. In an embodiment, the surfactant is nonionic. Examples of nonionic surfactants are polyethylene oxides, poly propylene oxides, acrylic polymers, and the like. In an embodiment, the surfactant is cationic such as alkyl ammonium salts such as tert butyl ammonium chlorides, or hydroxides. In an embodiment the flow modifier is provided in a range from about 0.01% to about 1% by weight of the total chip-packaging composition when it is prepared.

Another additive material according to an embodiment is a deforming agent. The specific deforming agent that is employed depends upon compatibility with the principal chip-packaging composition. The deforming agent is also referred to as a plasticizer. In an embodiment the deforming agent is provided in a range from about 0.1% to about 2% by weight of the total chip-packaging composition when it is prepared.

Another additive material according to an embodiment is a toughening agent. A toughening agent causes the chip-packaging composition to resist crack propagation. In an embodiment, an elastomer is used as the toughening agent. The specific elastomer that is employed to toughen the matrix depends upon compatibility with the chip-packaging composition. For example, an elastomer that is used with epoxy-functionalized compositions is carboxy-terminated polybutadiene-acrylonitrile (CTBN). CTBN is the generic name for a family of elastomer additives for epoxies, with the primary elastomer being functionalized butadine-acrylonitrile copolymer. These elastomers are available as epoxy, carboxy, amino and vinyl terminal functionalities. Other elastomers may be used that are compatible with a given chip-packaging composition. In an embodiment the toughening agent is provided in a range from about 1% to about 10% by weight of the total chip-packaging composition when it is prepared.

Another additive material according to an embodiment is a inorganic particulate filler. Inorganic particulate fillers that optionally are added to the chip-packaging mixtures include oxides of various elements such as silica, alumina, and others. Other inorganic particulate fillers include nitrides such as silicon nitride and the like. Other inorganic particulate fillers include conductive materials such as graphite, diamond, and the like. When an inorganic particulate filler is added, the chip-packaging mixture is more appropriately referred to as an "chip-packaging composite", in that it has inorganic particulate fillers as existing technology does, but it includes an chip-packaging composition according to various embodiments. The chip-packaging composite embodiments, unlike most other embodiments, include a more-than-one-phase substance. In an embodiment the inorganic particulate filler is provided in a range from about 1% to about 70% by weight of the total chip-packaging composite when it is prepared.

Figure 2A:
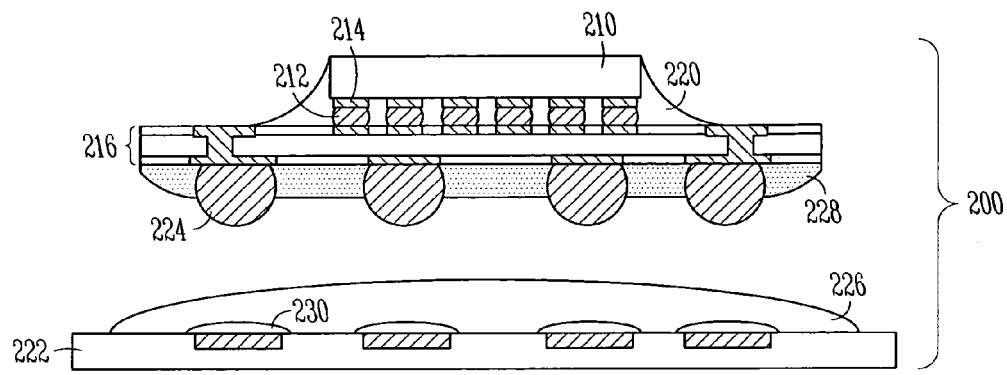
FIG. 2A is a cross-section of a package during processing according to an embodiment.

FIG. 2A is a cross-section of a package 200 during processing according to an embodiment. The package 200 includes a flip-chip 210 and a solder bump 212 that is attached to the flip-chip 210. Electrical coupling for the flip-chip 210 is accomplished through a die bond pad 214 that is landed on the flip-chip 210. The flip-chip-210 is disposed on a mounting substrate 216. The mounting substrate 216 is part of an interposer. In an embodiment, the mounting substrate 216 is part of a small PWB such as a board for a handheld device such as a cell phone or a PDA.

FIG. 2A also depicts a chip-packaging composition 220 that has acted to encapsulate the die bond pad 214. In an embodiment, the chip-packaging composition 220 includes a thermosetting resin, and at least one of the N-heterocyclic carbene catalysts and the cycloaliphatic hardeners according to any of the embodiments set forth in this disclosure. In an embodiment, at least one of the aforementioned additives is present as set forth in this disclosure.

In FIG. 2A, the mounting substrate 216 is depicted being brought near a board 222, which will be coupled to the mounting substrate 216 through a solder second bump 224. The solder second bump is depicted as about to penetrate a stress-compensation collar (SCC) precursor 226. In an embodiment, the SCC precursor 226 includes a thermosetting resin, and at least one of the N-heterocyclic carbene catalysts and the cycloaliphatic hardeners according to any of the embodiments set forth in this disclosure.

In an embodiment, the mounting substrate 216 includes a stress-relief layer (SRL) 228 that is in contact with the solder second bump 224. In an embodiment, the SRL 228 includes a thermosetting resin and at least one of the N-heterocyclic carbene catalysts and the cycloaliphatic hardeners according to any of the embodiments set forth in this disclosure.

In an embodiment, the board 222 is prepared with a substantially particle-free SCC 230, through which the solder second bump 224 passes upon mating the solder second bump 224 with the board 222. In an embodiment, the particle-free SCC 230 acts in concert with a SCC precursor 226 that includes up to about 50% or more particulate filler. The particle-free SCC 230 acts as a particle deflector during mating of the board 222 with the solder second bump 222.

Figure 2B:
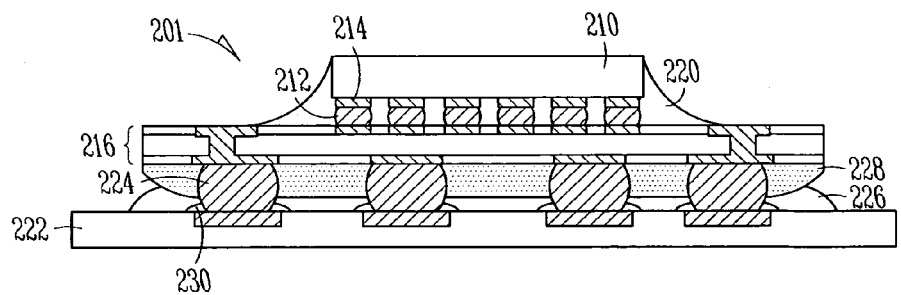
FIG. 2B is a cross-section of the package depicted in FIG. 2A after further processing according to an embodiment.

FIG. 2B is a cross-section of the package depicted in FIG. 2A after further processing according to an embodiment.

The package 201 is depicted after full assembly and curing of the various layers and after reflow of the various solder bumps. In an embodiment, curing is followed by reflowing of any of the solder bumps onto the various substrate bond pads. In an embodiment, curing and reflowing are carried out substantially simultaneously. In an embodiment, curing is carried out by various processing paths including autocatalytic, additive catalytic, diluent cross-linking/hardening, thermoset, and a combination thereof.

Figure 3:
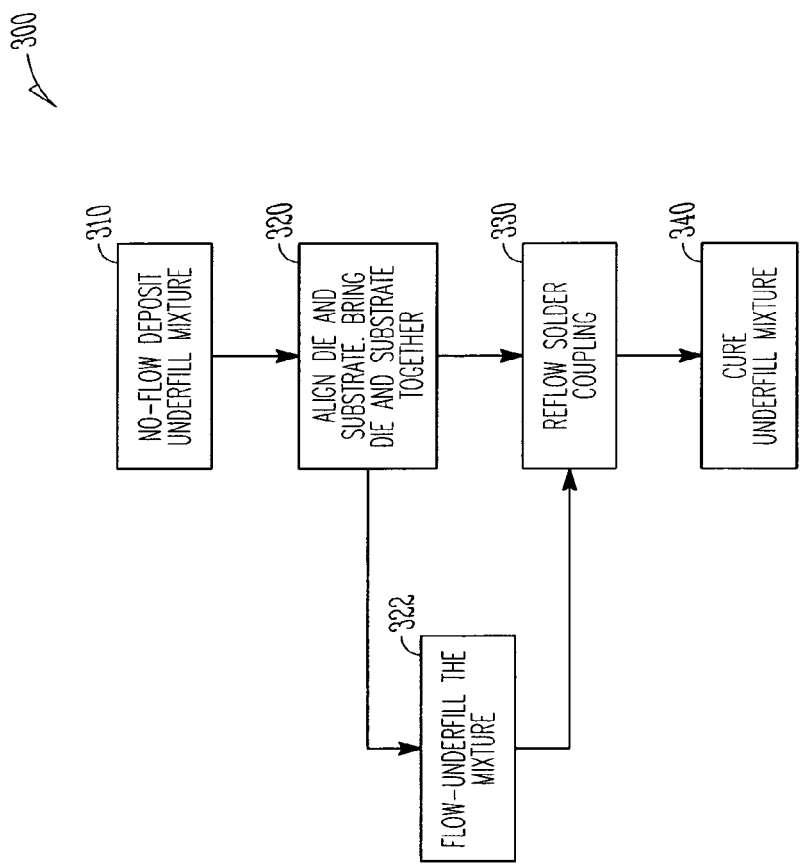
FIG. 3 is a process flow diagram according to an embodiment.

FIG. 3 is a process flow diagram 300 according to an embodiment.

At 310, the process includes no-flow depositing an underfill mixture onto a substrate. According to the various embodiments, the substrate can be any of the die, the mounting substrate, and/or the board.

At 320, the process includes aligning the die and the mounting substrate and bringing them together. According to an embodiment, the process can include aligning the mounting substrate and the board and bring them together by allowing the solder second bump to penetrate an SCC precursor.

In an embodiment, the process commences at 320, and branches to 322. At 322, the process includes flow underfilling the flip chip, followed by further processing.

At 330, the process includes reflowing the solder bump. The process can also include thermal activation of the at least one of the N-heterocyclic carbene catalysts and the cycloaliphatic hardeners in the underfill composition. According to an embodiment, the process includes reflowing the solder first bump against the mounting substrate. According to an embodiment, the process includes reflowing the solder second bump against the board. According to an embodiment, the process includes reflowing the solder first bump against the mounting substrate, and the solder second bump against the board.

At 340, the process includes curing the underfill composition.

In an embodiment, the chip-packaging composition is used in an injection molding process to encapsulate a chip according to known technique. Any chip-packaging composition embodiment can be used as an encapsulant.

Figure 4:
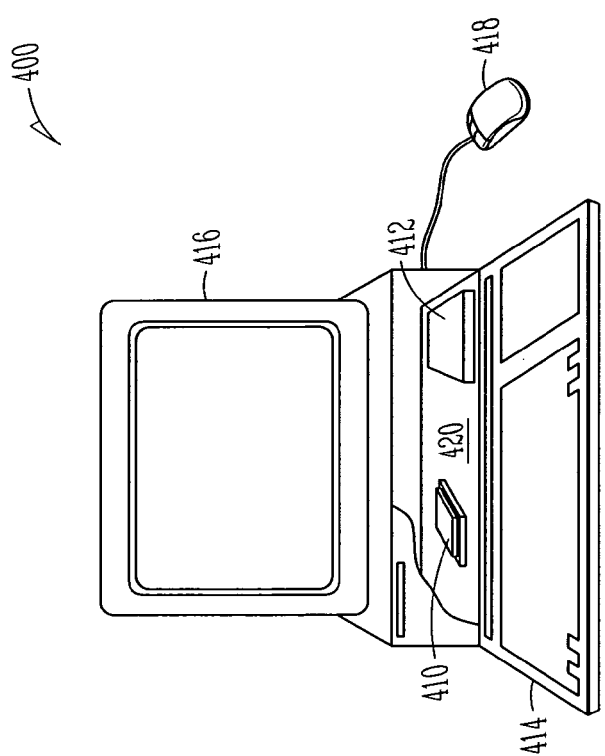
FIG. 4 is a depiction of a computing system according to an embodiment.

FIG. 4 is a depiction of a computing system 400 according to an embodiment. One or more of the foregoing embodiments of at least one of the N-heterocyclic carbene catalysts and the cycloaliphatic hardeners chip-packaging compositions, whether as compositions, mixtures, or composites, may be utilized in a computing system, such as a computing system 400 of FIG. 4. The computing system 400 includes at least one processor (not pictured), which is enclosed in a package 410, a data storage system 412, at least one input device such as keyboard 414, and at least one output device such as monitor 416, for example. The computing system 400 includes a processor that processes data signals, and may include, for example, a microprocessor, available from Intel Corporation. In addition to the keyboard 414, the computing system 400 can include another user input device such as a mouse 418, for example.

For purposes of this disclosure, a computing system 400 embodying components in accordance with the claimed subject matter may include any system that utilizes a at least one of the N-heterocyclic carbene catalysts and the cycloaliphatic hardeners chip-packaging composition, which may be coupled to a mounting substrate 420, for example, for a data storage device such as dynamic random access memory, polymer memory, flash memory, and phase-change memory. The chip-packaging composition that includes at least one of the N-heterocyclic carbene catalysts and the cycloaliphatic hardeners can also be coupled to a mounting substrate 420 for a die that contains a digital signal processor (DSP), a micro-controller, an application specific integrated circuit (ASIC), or a microprocessor.

Embodiments set forth in this disclosure can be applied to devices and apparatuses other than a traditional computer. For example, a die can be packaged with an embodiment of the chip-packaging composition that includes at least one of the N-heterocyclic carbene catalysts and the cycloaliphatic hardeners, and it can be placed in a portable device such as a wireless communicator or a hand-held device such as a personal digital assistant and the like. Another example is a die that can be packaged with a chip-packaging composition and at least one of the N-heterocyclic carbene catalysts and the cycloaliphatic hardeners, and placed in a vehicle such as an automobile, a locomotive, a watercraft, an aircraft, or a spacecraft.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A chip-packaging composition comprising:
   a cycloaliphatic amine hardener, wherein the cycloaliphatic amine hardener includes a diamine hardener, selected from

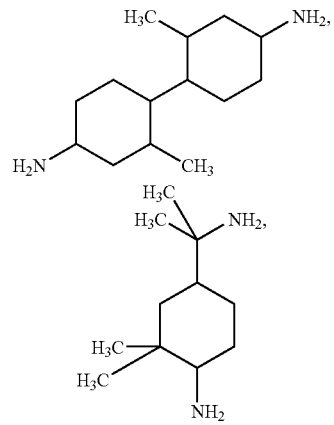

and combinations thereof;
   an epoxy resin; and
   the solution, reaction, and mixture products of the composition.

2. The chip-packaging composition of claim 1, wherein the cycloaliphatic amine hardener includes a diamine hardener.

3. The chip-packaging composition of claim 1, wherein the resin includes an epoxy resin, and wherein the cycloaliphatic amine hardener includes a diamine hardener.

4. The chip-packaging composition of claim 1, further including a particulate filler.

* * * * *